(12) United States Patent
Kim et al.

(10) Patent No.: US 8,344,754 B2
(45) Date of Patent: Jan. 1, 2013

(54) MULTI-CHIP PACKAGE

(75) Inventors: Kyoung Nam Kim, Gyeonggi-do (KR); Beom Ju Shin, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/982,544

(22) Filed: Dec. 30, 2010

(65) Prior Publication Data
US 2012/0032706 A1    Feb. 9, 2012

(30) Foreign Application Priority Data
Aug. 4, 2010   (KR) .................. 10-2010-0075250

(51) Int. Cl.
*H03K 17/16* (2006.01)
*H03K 19/0175* (2006.01)
*H03B 1/00* (2006.01)

(52) U.S. Cl. ............ 326/34; 326/82; 326/86; 327/108; 327/109

(58) Field of Classification Search .......... 326/34, 326/37–47, 101, 82–87; 327/108, 109
See application file for complete search history.

(56) References Cited

U.S. PATENT DOCUMENTS

| | | | |
|---|---|---|---|
| 5,319,589 A * | 6/1994 | Yamagata et al. | 365/49.15 |
| 8,001,513 B2 * | 8/2011 | Silvestri | 716/126 |
| 2007/0080718 A1 * | 4/2007 | Stojanovic et al. | 326/87 |
| 2007/0195613 A1 * | 8/2007 | Rajan et al. | 365/189.05 |
| 2008/0040081 A1 * | 2/2008 | Nishio et al. | 703/1 |
| 2008/0126690 A1 * | 5/2008 | Rajan et al. | 711/105 |
| 2009/0002030 A1 * | 1/2009 | Stojanovic et al. | 326/83 |
| 2009/0085608 A1 * | 4/2009 | Alzheimer | 326/86 |
| 2010/0176844 A1 * | 7/2010 | Wyman et al. | 326/82 |

FOREIGN PATENT DOCUMENTS
WO    WO 2009/045763    4/2009

OTHER PUBLICATIONS

Notice of Preliminary Rejection issued from Korean Intellectual Property Office on Sep. 30, 2011.

* cited by examiner

*Primary Examiner* — Thienvu Tran
(74) *Attorney, Agent, or Firm* — IP & T Group LLP

(57) ABSTRACT

A multi-chip package includes a plurality of chips coupled in parallel to an I/O pad and an output driver circuit included in each of the chips and configured to transmit output data to the I/O pad. The driving force of the output driver circuit is controlled on the basis of stack information indicative of the number of chips being activated.

11 Claims, 2 Drawing Sheets

MULTI-CHIP PACKAGE

CROSS-REFERENCE TO RELATED APPLICATION

The present application claims priority under 35 U.S.C. 119(a) to Korean patent application number 10-2010-0075250 filed on Aug. 4, 2010, the entire disclosure of which is incorporated by reference herein.

BACKGROUND

Exemplary embodiments relate to a multi-chip package and, more particularly, to a multi-chip package which is capable of reducing the peak current of an output driver circuit when an output operation is performed.

There has been a need for a reduction in the size and weight of electronic devices according to the recent development of the semiconductor industry and user needs. One of the techniques used to meet the need is a multi-chip packaging technique. The multi-chip packaging technique is used to integrate a plurality of semiconductor chips in one package. In terms of a reduction in the size and weight and the mounting area, it is more advantageous to use the multi-chip package than to use several packages each including one semiconductor chip.

FIG. 1 shows a diagram of a known double die package. Referring to FIG. 1, the double die package has a stack of a first chip 11 and a second chip 12. The output lines of the first chip 11 and the second chip 12 are coupled in parallel to an input/output (I/O) pad. When a read operation is performed, data read by the first chip 11 and the second chip 12 is output to an external host 21 via the I/O pad IO PAD.

FIG. 2 shows a circuit diagram of an output driver circuit included in both the first chip and the second chip shown in FIG. 1.

Referring to FIG. 2, the output driver circuit includes a plurality of drivers 11A (i.e., D1 to D5) coupled in parallel between an input/output (I/O) line IO and an I/O pad IO PAD. In a multi-chip package, when an output operation is performed, the output driver of one chip causes capacitor loading in view of the output driver of another chip stacked together with the one chip. Thus, in order to increase the size and driving force of drivers, the plurality of drivers, e.g., D1 to D5, are connected in parallel.

An output driver circuit included in each of the chips of a known multi-chip package is designed to be optimized for the multi-chip package in such a manner that the driving force of the output driver is appropriately enhanced by increasing the size of the output driver. However, if all the chips of the multi-chip package are not driven, the output driver circuit having the increased size may cause an unnecessary peak current.

BRIEF SUMMARY

Exemplary embodiments relate to a multi-chip package in which stack information of a multi-chip package is stored in the content addressable memory (CAM) cell of each chip as CAM data, the CAM data is read when a boot operation is performed, and the number of activated drivers of an output driver circuit is controlled on the basis of the read CAM data, so that the multi-chip package is capable of reducing a peak current through the output driver circuit having a size optimized for the number of chips.

In accordance with exemplary embodiments, a multi-chip package comprises a plurality of chips coupled in parallel to an I/O pad and an output driver circuit included in each of the chips and configured to transmit output data to the I/O pad. The driving force of the output driver circuit is adaptively controlled on the basis of stack information indicative of the number of chips being activated.

In accordance with another exemplary embodiment, the stack information is stored in the CAM cell of each of the chips.

In accordance with yet another exemplary embodiment, the output driver circuit includes a control signal generator configured to output a plurality of control signals on the basis of the stack information, a driver activation unit configured to output a plurality of driver enable signals in response to the control signals, and a driver unit having a plurality of drivers and configured to transmit the output data received through an I/O line, to the I/O pad in response to the driver enable signals and control the number of drivers being activated in response to the number of driver enable signals being activated, thereby adaptively controlling the driver size.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the exemplary embodiments of the disclosure.

Figure 1:
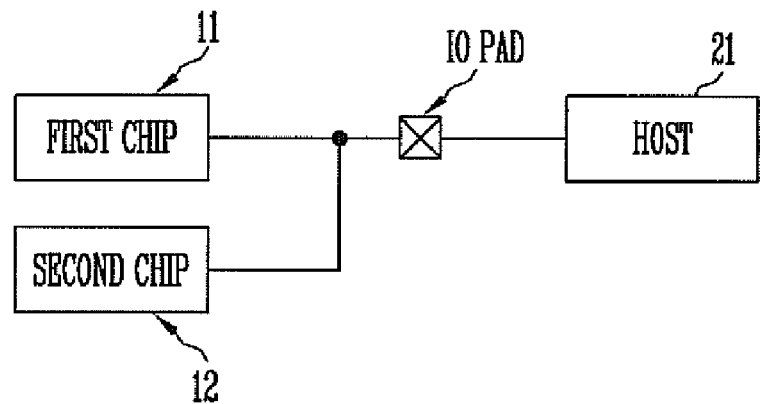
FIG. 1 shows a diagram of a known double die package.
Figure 2:
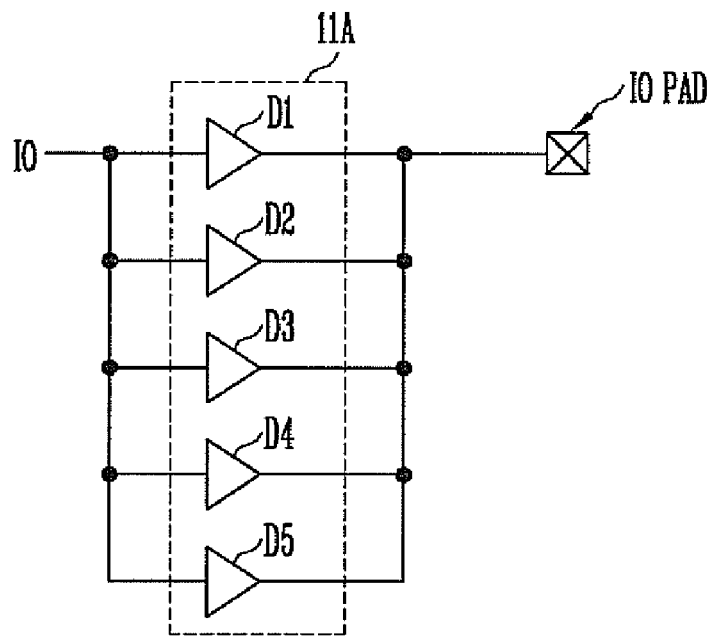
FIG. 2 shows a circuit diagram of an output driver circuit included in both the first chip and the second chip shown in FIG. 1.
Figure 3:
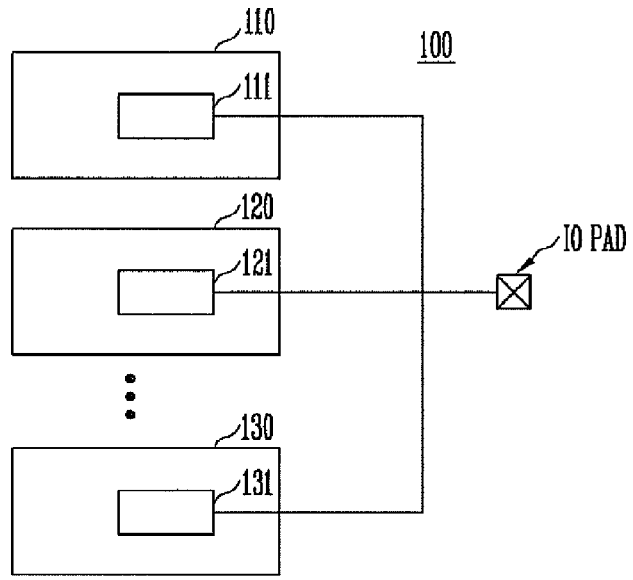
FIG. 3 shows a diagram of a multi-chip package according to an exemplary embodiment of this disclosure.

FIG. 3 shows a diagram of a multi-chip package according to an exemplary embodiment of this disclosure.

Referring to FIG. 3, the multi-chip package has a stack of plural chips 110 to 130. The total number of chips can be, for example, 2, 4, or 8.

The output lines of the chips 110 to 130 are coupled in parallel to one input/output (I/O) pad IO PAD. The chips 110 to 130 include respective output driver circuits 111, 121, and 131 for outputting read data to the I/O pad IO PAD. Each of the output driver circuits 111, 121, and 131 controls its driving force by controlling the number of drivers which are activated on the basis of content addressable memory (CAM) data. The CAM data indicates the number of chips actually used (i.e., the number of activated chips) in the multi-chip package.

Figure 4:
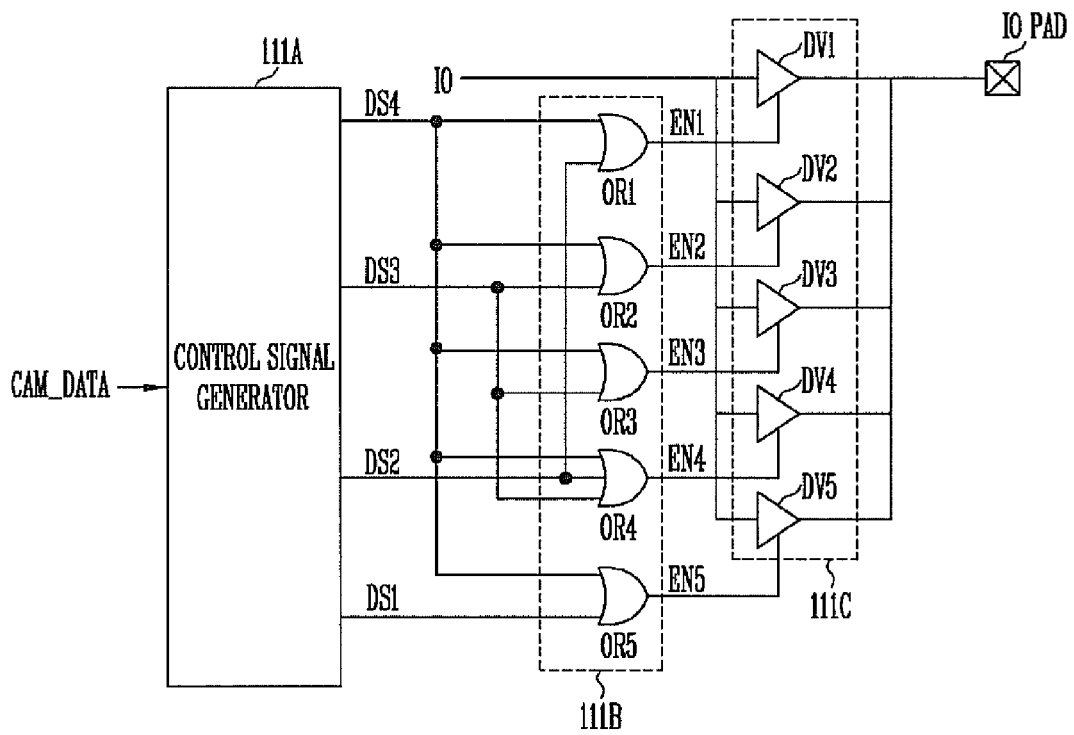
FIG. 4 shows a circuit diagram of an output driver circuit according to an exemplary embodiment of this disclosure.

FIG. 4 shows a circuit diagram of the output driver circuit according to an exemplary embodiment of this disclosure.

Referring to FIG. 4, the output driver circuit 111 includes a control signal generator 111A, a driver activation unit 111B, and a driver unit 111C.

The output driver circuit 111 controls the driving force of the corresponding chip by controlling the number of drivers activated from among a plurality of the drivers of a driver unit on the basis of CAM data. The CAM data includes chip stack information stored in the CAM cell of the chip.

The control signal generator 111A outputs a plurality of control signals DS1 to DS4 on the basis of CAM data, including stack information of a multi-chip package (i.e., information representing the number of chips actually used).

The driver activation unit 111B outputs a plurality of driver enable signals EN1 to EN5 in response to the plurality of control signals DS1 to DS4. The driver activation unit 111B includes a plurality of OR gates OR1 to OR5. The OR gate OR1 outputs the first driver enable signal EN1 by logically combining the fourth control signal DS4 and the second control signal DS2. The OR gate OR2 outputs the second driver enable signal EN2 by logically combining the fourth control signal DS4 and the third control signal DS3. The OR gate OR3 outputs the third driver enable signal EN3 by logically combining the fourth control signal DS4 and the third control signal DS3. The OR gate OR4 outputs the fourth driver enable signal EN4 by logically combining the fourth control signal DS4, the third control signal DS3, and the second control signal DS. The OR gate OR5 outputs the fifth driver enable signal EN5 by logically combining the fourth control signal DS4 and the first control signal DS1.

The driver unit 111C includes a plurality of drivers DV1 to DV5 coupled in parallel between an I/O line IO within the chip and an I/O pad IO PAD. Each of the drivers DV1 to DV5 is activated in response to a corresponding one of the first to fifth driver enable signals EN1 to EN5. Further, each of the drivers DV1 to DV5 is configured to output/drive output data, received through the I/O line IO, to the I/O pad IO PAD.

Table 1 lists drivers activated on the basis of stack information.

TABLE 1

|     | DS1 = 1 | DS2 = 1 | DS3 = 1 | DS4 = 1 |
| --- | --- | --- | --- | --- |
| DV1 | Disable | Disable | Enable | Enable |
| DV2 | Disable | Enable | Disable | Enable |
| DV3 | Disable | Disable | Enable | Enable |
| DV4 | Disable | Enable | Enable | Enable |
| DV5 | Enable | Disable | Disable | Enable |
| Stack Information | SDP | DDP | QDP | ODP |

Referring to Table 1, in a case where eight chips are used in a multi-chip package having a stack of eight chips (i.e., stack information=ODP), when the fourth control signal DS4 is activated, all the drivers DV1 to DV5 are driven, thereby raising the driving force of the multi-chip package to its highest value. In this case, the remaining control signal DS1, DS2, and DS3 are inactivated. In a case where four chips are used (i.e., stack information=QDP), when the third control signal DS3 is activated, the drivers DV1, DV3, and DV4 are driven. Accordingly, the driving force is reduced and a peak current is decreased as compared with a case in which eight chips are used (i.e., stack information=ODP). Here, the remaining control signals DS1, DS2, and DS4 are inactivated. In a case where two chips are used (i.e., stack information=DDP), when the second control signal DS2 is activated, the drivers DV1 and DV4 are driven. Accordingly, the driving force is reduced and a peak current is decreased as compared with a case in which four chips are used (i.e., stack information=QDP). Here, the remaining control signals DS1, DS3, and DS4 are inactivated. In a case where one chip is used (i.e., stack information=SDP), when the first control signal DS1 is activated, the driver DV5 is driven. Accordingly, the driving force is reduced, and a peak current is decreased as compared with a case in which two chips are used (i.e., stack information=DDP).

As described above, according to the exemplary embodiments of this disclosure, the size of drivers of the output driver circuit included in each chip can be adjusted or controlled according to the number of chips actually used in a multi-chip package by adjusting the number of drivers to be enabled. Accordingly, the driving force of a chip can be optimized, and a peak current can be decreased.

Furthermore, stack information of a multi-chip package is stored in the CAM cell of each chip as CAM data, the CAM data is read when a boot operation is performed, and the number of activated drivers of an output driver circuit is adjusted or controlled on the basis of the read CAM data. Accordingly, a peak current can be reduced utilizing the output driver circuit having a driving force optimized for the number of chips.

What is claimed is:

1. A multi-chip package, comprising:
   a plurality of chips coupled in parallel to an I/O pad; and
   an output driver circuit included in each of the chips and configured to comprise a plurality of drivers,
   wherein the output driver circuit comprises:
     a control signal generator configured to output a plurality of control signals on the basis of stack information;
     a driver activation unit configured to output a plurality of driver enable signals in response to the control signals; and
     a driver unit having a plurality of drivers and configured to transmit output data received through an I/O line, to the I/O pad in response to the driver enable signals and control a number of drivers being activated in response to a number of the driver enable signals being activated.

2. The multi-chip package of claim 1, wherein the stack information is included in a Content Addressable Memory (CAM) cell of each of the chips.

3. The multi-chip package of claim 2, wherein when one of the control signals is activated, a corresponding one of drivers is activated.

4. The multi-chip package of claim 2, wherein the driver activation unit controls the number of driver enable signals being activated, in response to an activated one of the control signals.

5. The multi-chip package of claim 2, wherein the driver activation unit comprises a plurality of logic gates configured to generate the driver enable signals by logically combining the control signals.

6. The multi-chip package of claim 2, wherein:
   the drivers of the driver unit are coupled in parallel between the I/O pad and an I/O line within each of the chips, and
   each of the drivers is activated in response to corresponding one of the driver enable signals.

7. A multi-chip package, comprising:
   a plurality of chips each comprising an output driver circuit; and
   an I/O pad to which the output driver circuits are coupled in common,
   wherein the output driver circuit comprises:
     a control signal generator configured to output a plurality of control signals on the basis of stack information;
     a driver activation unit configured to output a plurality of driver enable signals in response to the control signals; and
     a driver unit having a plurality of drivers and configured to transmit output data received through an I/O line, to the I/O pad in response to the driver enable signals and control a driving force of the output driver circuit by controlling a number of drivers being activated in response to a number of the driver enable signals being activated.

8. The multi-chip package of claim 7, wherein the stack information is stored in a Content Addressable Memory (CAM) cell of each of the chips.

9. The multi-chip package of claim 7, wherein the driver activation unit controls the number of driver enable signals being activated, in response to an activated one of the control signals.

10. The multi-chip package of claim 7, wherein the driver activation unit comprises a plurality of logic gates configured to generate the driver enable signals by logically combining the control signals.

11. The multi-chip package of claim 7, wherein:
the drivers of the driver unit are coupled in parallel between the I/O pad and an I/O line within each of the chips, and
each of the drivers is activated in response to corresponding one of the driver enable signals.

* * * * *